United States Patent
Kutter et al.

(10) Patent No.: US 9,978,626 B2
(45) Date of Patent: May 22, 2018

(54) CARRIER WAFER, METHOD FOR HOLDING A FLEXIBLE SUBSTRATE AND METHOD FOR THE MANUFACTURE OF A CARRIER WAFER

(71) Applicant: FRAUNHOFER-GESELLSCHAFT zur Foerderung der angewandten Forschung e.V., Munich (DE)

(72) Inventors: Christoph Kutter, Munich (DE); Christof Landesberger, Graefelfing (DE); Dieter Bollmann, Munich (DE)

(73) Assignee: Fraunhofer-Gesellschaft zur Foederung der angewandten Forschung e.V., Munich (DE)

( * ) Notice: Subject to any disclaimer, the term of this patent is extended or adjusted under 35 U.S.C. 154(b) by 153 days.

(21) Appl. No.: 14/814,835

(22) Filed: Jul. 31, 2015

(65) Prior Publication Data
US 2016/0035611 A1 Feb. 4, 2016

(51) Int. Cl.
*H02N 13/00* (2006.01)
*H01L 21/683* (2006.01)

(52) U.S. Cl.
CPC ...... *H01L 21/6833* (2013.01); *H01L 21/6835* (2013.01); *H02N 13/00* (2013.01); *H01L 2221/68381* (2013.01)

(58) Field of Classification Search
CPC .............. H01L 21/6833; H01L 21/6835; H01L 21/6831; H01L 21/67103; H02N 13/00
USPC ........................................................ 361/234
See application file for complete search history.

(56) References Cited

U.S. PATENT DOCUMENTS

| | | | | |
|---|---|---|---|---|
| 6,280,584 B1* | 8/2001 | Kumar | ................... | H02N 13/00 118/666 |
| 6,781,669 B2* | 8/2004 | Tanaka | ................... | G03F 7/7075 355/53 |
| 7,782,593 B2 | 8/2010 | Bollman | | |
| 2003/0032301 A1* | 2/2003 | Dhindsa | ............ | C23C 16/45565 438/758 |
| 2011/0211392 A1* | 9/2011 | Kim | ................... | G11C 16/0408 365/185.2 |

FOREIGN PATENT DOCUMENTS

DE    10 2006 055 618 A1    5/2008

* cited by examiner

*Primary Examiner* — Dharti Patel
(74) *Attorney, Agent, or Firm* — Marshall & Melhorn, LLC (57) ABSTRACT

Carrier wafers are used to hold thin and ultra-thin substrates such as semiconductor components, for example. The carrier wafer of the invention has a plurality of electrodes insulated on all sides (floating electrodes). This plurality of floating electrodes, but at least 50 floating electrodes, are located next to one another with reference to the plane of the first surface of the carrier wafer. Each of these floating electrodes can be charged, for example by means of Fowler-Nordheim tunnels or by the injection of hot charge carriers, in particular of hot electrons or hot holes. Also provided are a method for holding a flexible substrate by means of a carrier wafer of this type and a method for the manufacture of a carrier wafer of this type.

22 Claims, 5 Drawing Sheets

CARRIER WAFER, METHOD FOR HOLDING A FLEXIBLE SUBSTRATE AND METHOD FOR THE MANUFACTURE OF A CARRIER WAFER

BACKGROUND OF THE INVENTION

This invention relates to a carrier wafer, a method for holding a flexible substrate by means of a carrier wafer of this type and a method for the manufacture of a carrier wafer of this type. Carrier wafers are used to hold thin and ultra-thin substrates such as semiconductor components, for example.

Thin semiconductor components have been widely used in the microelectronics industry in recent years. Examples of such uses are integrated circuits for chip cards in which the thickness of the silicon components is currently approximately 150 μm and less. Increasingly thinner wafers are also being used in the manufacture of solar cells. Chips with a thickness of 100 μm and less are also used in power semiconductors. Last but not least, electronic components made of organic semiconductors on thin plastic films are also used in polymer electronics, such as organic light-emitting diodes (OLED), for example.

One problem in the handling of such thin substrates is the danger that the substrate may break. Thin substrates of this type also lose their stability and bend under their own weight and inertia, frequently by several millimeters. Therefore normal handling devices that remove the substrate from a kiln and transport it through various processing stations can no longer be used.

An additional problem is presented by the sharp edges of the thin substrates, which cause problems during transport and handling.

Hence, there is a need to develop handling techniques that make it possible to handle and process thin substrates of this type.

It is known that substrates such as thin wafers or chips can be handled by adhesively connecting them to a carrier plate. In this method, it is decisive that the thin substrate must be supported by a thick carrier wafer. The substrate is thereby stabilized and held flat.

The carrier wafer can be connected to the substrate by an adhesive, for example, such as wax, a thermoplastic adhesive or a foil that is adhesive on both sides. In certain situations the use of adhesives or films is not appropriate, e.g. because they would be destroyed by high temperatures or by certain chemicals. Under some conditions, adhesive residue remains on the surface of the substrate after the substrate has been processed and removed from the carrier wafer, which results in the undesirable contamination of the equipment.

In plasma plants, the principle of the electrostatic chuck has long been known. After the wafer to be processed is placed on the electrostatic chuck, a direct current is applied between the anode of the plasma reactor and the back side of the electrostatic chuck. The resulting electrical field between the back side of the wafer and the insulation layer of the chuck holds the utilizable wafer securely and makes possible, among other things, a cooling of the back side of the wafer by the admission of small quantities of helium gas. However, the electrostatic chuck described above is a stationary component of the plasma plant and therefore cannot be transported together with the substrate between different processing stations.

DE 10 2006 055 618 A1 describes a mobile holder for thin substrates on which a flat electrode, insulated on all sides and made of conductive material is located. The conductive floating electrode is completely surrounded by insulating material so that it is called a floating electrode. The insulating material can be applied in the form of one or more dielectric layers. This floating electrode can now be charged, for example, by means of a tunnel window, for example, whereby because it is insulated on all sides, the potential of this floating electrode is initially not defined (floating).

To hold a substrate, e.g. a utilizable wafer, first the utilizable wafer is placed on a carrier wafer with a discharged floating electrode. Then the floating electrode is charged, e.g. to a potential from 10 V to 1,000 V with respect to its environment.

After this charging process with a voltage applied temporarily, for example to a tunnel window in the insulation of the floating electrode, the electrical charges are permanently stored in the floating electrode. The wafer is then securely held by the electrostatic forces of the floating electrode and can be processed, transported and stored.

The insulation on all sides ensures that the charged state of the floating electrode is retained for a long period of time. For this purpose, however, great care must be taken during the manufacture of the carrier wafer to guarantee that is remains insulated and to prevent leakage currents. Even extremely small leaks in the insulation would result directly in the discharge of the floating electrode, so that it would no longer be suitable for the long-term holding of a thin utilizable wafer.

After processing, the utilizable wafer is again removed from the carrier wafer by discharging the floating electrode. This can be accomplished, for example, by the application of an oppositely poled high voltage, an alternating voltage with decreasing amplitude and/or by exposure to UV light. The utilizable wafer can then be removed from the carrier wafer almost without force.

A disadvantage with the carrier wafer known from DE 10 2006 555 618 A1 is that if there is the slightest defect in the insulation layers that insulate the electrode on all sides, a leakage current occurs that results in a discharge of the floating electrode. Because the floating electrode in this carrier wafer has a large surface area, the probability of a defect in the insulation layer is very high, so that these carrier wafers frequently fail.

SUMMARY OF THE INVENTION

Starting from this prior art, the object of this invention is therefore to indicate a carrier wafer, its use for holding a thin substrate and a method for the manufacture of a carrier wafer of this type, with which a flexible thin substrate can be securely held.

This object is accomplished by the carrier wafer described in claim 1, the holding method described in claim 13 and the manufacturing method described in claim 16. Advantageous developments of the carrier wafer and method according to the invention are described in the respective dependent claims.

This invention teaches a carrier wafer that has a first flat surface for the electrostatic holding of a flexible substrate. The substrate held can be semiconductors such as semiconductor wafers, films, plastic films or even paper. Additional thin substrates that are not explicitly cited above can also be held by the carrier wafer according to the invention.

The carrier wafer according to the invention has a plurality of electrodes that are insulated on all sides (floating electrodes). This plurality of floating electrodes, however at least floating 50 electrodes, are located one next to another with reference to the plane of the first surface of the carrier wafer. Each of these floating electrodes can be charged by means of Fowler-Nordheim tunnels or by injection of hot charge carriers, in particular of hot electrons or hot holes.

The number of floating electrodes should thereby be at least 50, although it can advantageously be increased to more than 1000 floating electrodes, more than 10,000 floating electrodes, more than 100,000 floating electrodes or even more advantageously more than 1 million floating electrodes.

Because a plurality of floating electrodes are located on the surface of the carrier wafer, substrates located on it are also held securely even if individual insulated electrodes cannot be held on account of weaknesses in their insulation, such as, for example, trapped charges or other defects, cannot hold their original charge but discharge over time. On account of the large number of insulated electrodes, defects of this type in the insulation layer always affect only some of the insulated electrodes so that a secured charging of a remaining plurality of insulated electrodes over the long-term can be achieved.

The floating electrodes can be charged with charges of equal polarity, thereby resulting in a unipolar carrier wafer. Alternatively, the insulated electrodes can also be divided into two groups of electrodes that are charged, for example, with charge carriers of different polarity. This results in a bipolar carrier wafer.

The insulated electrodes can be divided not only into two groups, but into any desired number of groups, whereby each of the groups advantageously has its own feeder conductor for the charging of all insulated electrodes in the group. For example, insulated electrodes to be charged negatively and insulated electrodes to be charged positively can be located next to one another and can be provided with different feeder conductors.

The number of groups of floating electrodes is therefore unlimited and can be selected arbitrarily. A carrier wafer according to the invention can be constructed particularly easily if a common feeder conductor is provided for all floating electrodes that are to be charged with charge carriers of one polarity.

The floating electrodes are charged by means of at least one feeder electrode and at least one counter-electrode to which a voltage can be applied for the charging of the floating electrodes, for example by means of accessible contacts. For example, a common feeder electrode and/or a common counter-electrode can be provided for all floating electrodes. It is also possible to provide individual feeder electrodes and/or an individual counter electrode for individual electrodes or groups of floating electrodes.

The insulation layer advantageously has, next to each of the floating electrodes, an area by means of which the floating electrode can be charged, i.e. an area of this type is located below or above the floating electrodes. This area can be in the form of a tunnel window in the electrode insulation, for example, so that the floating electrode can be charged via this tunnel window by means of Fowler-Nordheim tunnels. Alternatively, the area can also represent the gate of a transistor structure, whereby the transistor structure generates hot charge carriers (hot electrons or hot holes) that are injected into the floating electrode through the insulation layer. Because the charging of a floating electrode by means of the injection of hot charge carriers is independent of the thickness of the insulation layer, significantly thicker insulation layers can be selected then when charging is performed via the tunnel mechanism.

The carrier wafer can have a carrier layer made of an electrically insulating material, on or in a front side of which the plurality of floating electrodes are located directly or by means of intermediate layers. An additional insulating layer is also located on the floating electrodes so that the individual floating electrodes are also electrically insulated on all sides by the carrier layer, the intermediate layers and the insulation layers located on it.

The plurality of floating electrodes can be arranged in different patterns. For example, individual groups of floating electrodes can be located in groups next to one another and at some radial distance from one another. Alternatively, the floating electrodes of each group can form a hexagon and the individual groups of floating electrodes can be arranged in a honeycomb pattern in relation to one another. An arrangement of the floating electrodes of the groups in rows and columns, at some distance from one another in parallel or in a checkerboard pattern is also possible. Basically any desired arrangement, including fractal arrangements, for example, is possible. In a fractal arrangement, the two or more groups are intimately intertwined with one another similar to the trunk and branches of a tree or the capillaries of arteries and veins in lung tissue. As a result, the arrangement is independent of random interference with regular arrangements in the utilizable wafer.

In another embodiment of the current invention, for two, a plurality of or all groups of floating electrodes, the floating electrodes of each group are arranged in a row and the groups of floating electrodes are separate and parallel to one another.

The discharge of the floating electrodes, which is necessary before the release of the flexible substrate being held, can be affected or assisted by the exposing the floating electrodes to suitable UV light, for example. As a result of the excitation with the high-energy UV light, the electrons enclosed in the floating electrode are discharged through the insulation layer. To make possible an irradiation of this type with UV light, the carrier layer of the carrier wafer, the floating electrodes or the insulation layers can advantageously consist of, entirely or partly, or can contain or be comprised of materials that are transparent for UV light. The carrier layer of the carrier layer wafer can particularly advantageously consist of, contain, or be comprised of glass, quartz glass and/or sapphire or holes.

The floating electrodes can also be discharged by the application of an alternating current with a timed decrease in voltage amplitudes.

The floating electrodes are preferably manufactured with a lateral dimension $A_e$ in the plane of the first surface or of the carrier layer between 100 nm and 10 mm, preferably 100 nm up to and including 1 mm, advantageously 100 nm up to and including 100 µm, preferably 1 µm up to and including 100 µm.

The ratio of the total surface area of the floating electrodes in the plane of the first surface to the total surface area of the first surface is thereby advantageously 5%, preferably ≥25%, advantageously ≥50%.

The areas for charging the floating electrodes should be small with respect to the surface area of the neighboring floating electrode. For example, it can have a lateral dimension $A_t$ in the plane of the carrier layer between 50 nm and 100 µm, for example, preferably between 100 nm and 3 µm, preferably between 1 µm and 3 µm. Areas of this type, as described above, can in particular be tunnel windows that have a reduced thickness of the insulation layer compared to the neighboring areas of the insulation layer. A typical layer thickness of the insulation layer in tunnel windows is 7 nm, preferably ≥10 nm and/or up to ≥100 nm for typical charging voltages of 10 to 1000 V. Of course, when higher voltages are used a greater thickness of the tunnel window can be selected. Overall, the surface area of the tunnel window is very small, for example ≤20%, preferably ≤0.1%, compared to the surface area of the electrode to be charged and/or ≤$10^{-4}$%, preferably ≤$10^{-5}$% of the total surface area of the carrier wafer. With such dimensions of the insulation layer and of the tunnel window it is possible, in the presence of conventional defect densities of approximately 1/cm² which are achieved in modern semiconductor plants, to manufacture sufficiently defect-free insulated electrodes, so that a good holding force of the electrostatic wafer can be achieved, even if some of the insulated electrodes fail on account of a loss of charge.

The tunnel window forms the weakest point in the insulation and thus the site of the potential loss of charge from the respective floating electrode. Because the floating electrodes have only one tunnel window and the counter-electrode has the thicker, significantly more stable oxide, the probability of two defects—one in the tunnel window and a second in the insulation between the floating electrode and the counter-electrode—is very low. Therefore the risk of a short circuit during charging is also very low. If a short circuit were to occur during charging, the cells could no longer be charged simultaneously, the entire current would flow via the short circuited cell and thus no voltage could be built up for the parallel charging of the many cells. For this reason, two design criteria must be taken into consideration: (1) the insulation on the counter-electrode must be significantly thicker than on the tunnel electrode. This is achieved by a suitably thicker oxide (or oxide layers). (2) The capacitance of the floating electrode and counter-electrode must be high enough that the voltage drop (see capacitance equivalent circuit diagram) occurs primarily via the tunnel window.

The manufacturing method claimed by the invention for the manufacture of a carrier wafer as described above is thereby characterized in that a plurality of floating electrodes are located directly or by means of intermediate layers on a flat carrier layer of a carrier wafer, which preferably consists of or comprises an electrically insulating material. As mentioned above, at least 100 floating electrodes, advantageously however up to 1 million floating electrodes are provided. In turn, on each of the floating electrodes, directly or via intermediate layers, at least one electrical insulation layer is applied, so that the carrier layer together with the electrical insulation layers completely covers and insulates the respective floating electrode. The insulator material can hereby be silicon oxide, although it can also be other insulating materials that are compatible with the manufacturing process (e.g. nitride, TEOS, aluminum oxide and other oxides used in semiconductor manufacturing). The insulator material can also be made at least partly of a sequence of layers, such as oxide-nitride-oxide sequences of layers, for example.

Furthermore, on the front side or the back side (in this case via interlayer connections), for example via intermediate layers on the carrier layer, electrical lines (feeder electrodes) running next to the floating electrodes are installed. In the case of a unipolar carrier wafer, an electrical line connected with all of the areas for charging the individual floating electrodes will suffice. For the case of a bipolar carrier wafer, the floating electrodes are divided into at least two groups of floating electrodes, whereby each of the groups of floating electrodes or areas of them are connected with at least one electrical line for charging. In the case of charging with hot charge carriers, the feeder electrodes must be commensurate with the related high current requirement.

If the feeder electrodes are installed on the front side, they can be connected on the front side or also, via interlayer contacts, on the back side with a voltage source and the floating electrodes can be charged.

If the in feed electrodes are installed on the back side, the electrodes can be connected with a voltage source on the back side or also, by means of interlayer contacts, on the front side. One of the feeder electrodes can form the wafer itself.

Finally, the electric lines are advantageously provided with an open electrical contact located on the surface of the carrier wafer, by means of which an appropriate voltage can be applied to the electrical lines and thus to the areas for charging for each individual floating electrode.

To charge the floating electrode, a voltage must be applied to two feeder electrodes so that by means of the tunnel window a voltage is applied that makes possible a tunneling into the floating electrode (see capacitance equivalent circuit diagram). The two feeder electrodes have a capacitive overlap with the floating electrode. In this case, one of the feeder electrodes has the tunnel window (oxide with reduced oxide thickness compared to the other insulation) to the floating electrode. The other electrode has no tunnel oxide but the conventional insulation oxide (or insulation material—see above). In the case of charging by means of hot charge carriers, the floating electrode forms the gate of the transistor. In this case, the feeder electrode is located underneath the gate (separated by gate insulation) with the areas source, channel and drain. In addition, another electrode is necessary that is capacitively coupled to the gate (the floating electrode) to be able to control the voltage in the floating electrode.

The holding method claimed by the invention for the holding of a flexible substrate by means of electrostatic force on a carrier wafer of the type described above is characterized in that in a first step, the flexible substrate (the utilizable wafer) is placed on the first flat surface of the carrier wafer. Then at least one, a plurality or all of the electrodes are electrically charged by applying voltages for the floating electrodes between their feeder electrodes and their counter-electrodes. These voltages are then de-energized, so that the thin flexible substrate is held by means of the electrostatic force of the charged floating electrodes on the flat surface of the carrier wafer.

In the case of a bipolar carrier wafer, these floating electrodes are charged so that advantageously two floating electrodes located next to each other have different voltages. The different voltages thereby advantageously have opposite polarity (positive and negative) relative to the ground potential, because the holding force for the utilizable wafer results from the difference between the potentials. The different voltages can thereby be applied simultaneously or one after the other. For this purpose, the carrier wafer can be made of either of UV-permeable material (e.g. quartz glass) or can be made of silicon, for example, with specially clear-etched areas that are UV permeable and therefore make the removal possible.

For the removal of the flexible substrate being held, the carrier wafer is irradiated with UV light until the floating electrodes are completely discharged. The flexible thin substrate can then be easily removed from the carrier wafer.

Several examples of carrier wafers claimed by the invention and their use are described below. The same or similar reference numbers thereby identify identical or similar elements, to avoid unnecessary repetition in the description. The examples described below incorporate several advantageous features that are necessary as well as optional. However, the individual optional features can thereby also be implemented independently of the other optional features used in the respective example to improve the invention.

BRIEF DESCRIPTION OF THE DRAWINGS

In the accompanying figures.

DETAILED DESCRIPTION OF THE INVENTION

Figure 1:
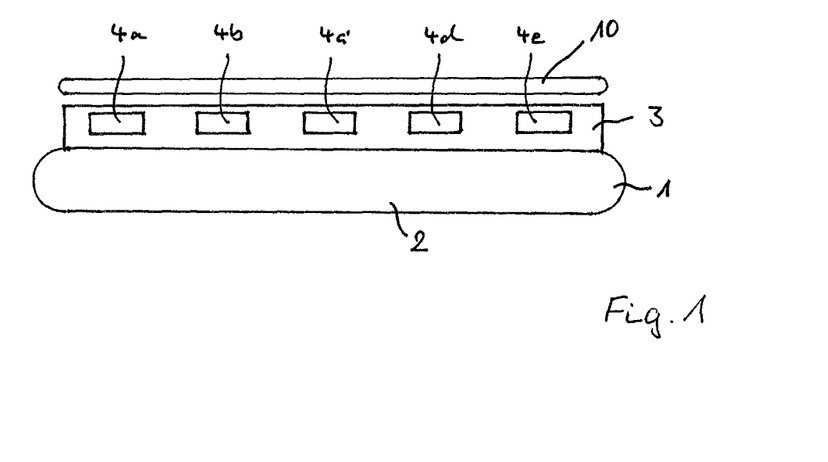
FIGS. 1 to 4 show cross-sections through carrier wafers claimed by the invention.

FIG. 1 shows a cross-section through a carrier wafer 1. This carrier wafer 1 has a substrate 2 on which an insulating layer 3 is located and embedded in the insulating layer 3 are electrodes 4a to 4e which are electrically insulated on all sides by the insulating layer 3. Electrodes of this type insulated on all sides are also called floating electrodes. They have no defined potential.

According to the invention, to hold a utilizable wafer 10, the floating electrodes 4a to 4e are charged with electrical charge carriers. For a unipolar carrier wafer 1 this charge can be delivered by means of identical charge carriers, e.g. only with electrons. For a bipolar carrier wafer, the floating electrodes located next to one another can be charged with charge carriers of different polarity, e.g. the floating electrodes 4a, 4c and 4e can be charged with electrons and the floating electrodes 4b and 4d can be charged with holes.

The floating electrodes 4a to 4e charged in this manner generate electrical field that is sufficiently strong to securely hold a utilizable wafer 10 on the surface of the insulation layer 3 and thus on the surface of the carrier wafer 1.

Figure 2:
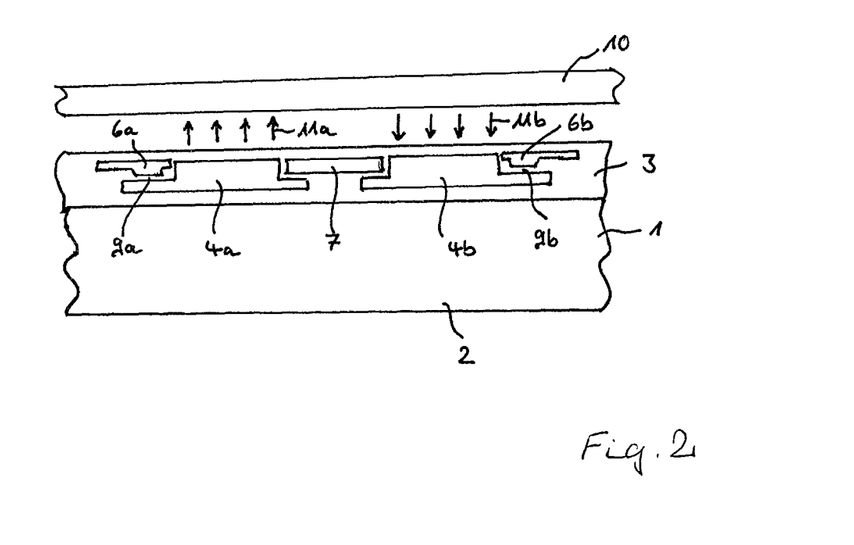

FIG. 2 shows a detail of the cross-section of an additional carrier wafer 1. This carrier wafer 1 in turn has a carrier layer/substrate 2 on which an insulation layer 3 is located. In the illustrated detail, in this insulation layer in turn are two floating electrodes 4a, 4b. These electrodes are insulated on all sides by the insulation layer 3. The floating electrodes 4a and 4b have, laterally in the plane of the insulation layer 3, thinner areas, above which are located on one hand feeder lines 6a and 6b, and on the other hand a feeder line with counter-electrode 7.

The feeder lines 6a and 6b are thicker in the vicinity of the floating electrodes 4a and 4b and are located in the vicinity of the areas to the sides of the floating electrodes 4a and 4b that the insulation layer 3 has a thinner area 9a, 9b between the feeder lines 6a and 6b and the neighboring areas of the floating electrodes 4a and 4b. The areas 9a and 9b are then capable of feedering electrons or holes into the floating electrodes 4a or 4b by means of Fowler-Nordheim tunnels. The area 9a and the area 9b therefore function as tunnel windows.

After charging of the floating electrodes 4a with charge carriers of one polarity, e.g. floating electrons, and the floating electrode 4b is charged with charge carriers of opposite polarity, e.g. holes, between the floating electrodes 4a and 4b, between the surface of the insulation layer 3 and the utilizable wafer 10 an electrical field indicated by the arrows 11 lowercase a and 11b results. As a result of this electrical field, the utilizable wafer 10 is held firmly on the surface of the insulation layer 3.

Figure 3:
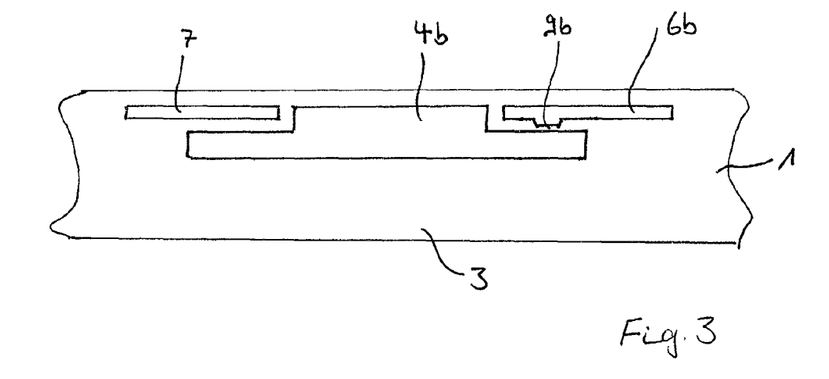

FIG. 3 shows an additional carrier wafer 1 according to the invention, the carrier layer of which is in the form of an insulating layer 3. FIG. 3 thereby shows a detail in cross-section, in which a floating electrode 4b is on one hand next to a feeder line 6b as well as next to a feeder line 7 in the form of a counter-electrode.

Figure 4:
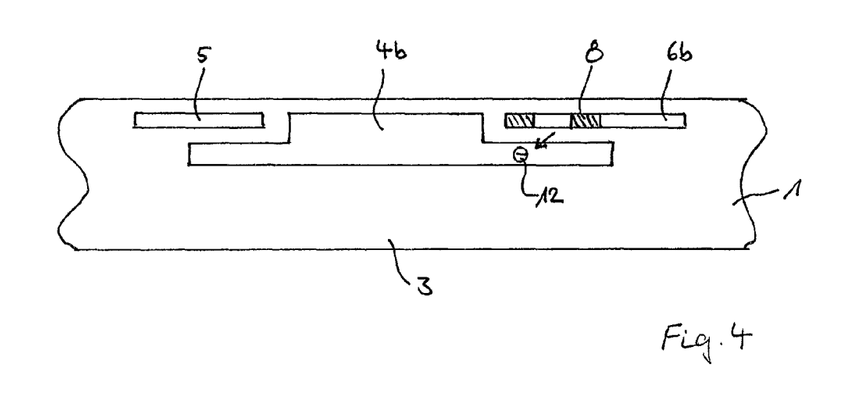

FIG. 4 shows an alternative claimed by the invention of a carrier wafer in which there is no tunnel window between the floating electrode 4b and the feeder line 6b. Instead, above the neighboring area of the floating electrode 4b, in the feeder line 6b, there is a transistor structure 8 by means of which hot charge carriers, in this case hot electrons 12, for example, can be generated. These hot electrodes 12 are then injected into the areas of the electrode 4b next to the transistor structure 8. In this manner, the floating electrode 4b is charged.

Figure 8:
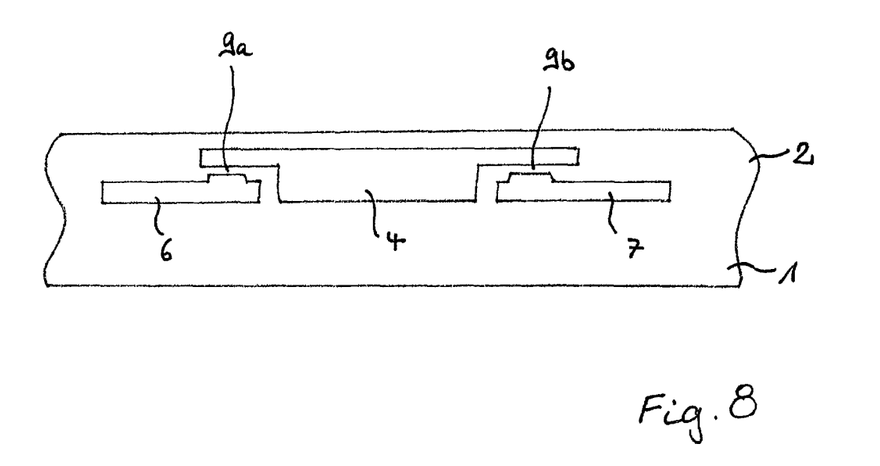
FIG. 8 shows a cross-section through a carrier wafer of an embodiment of the invention.

Although the feeder lines 6 and 7 in FIGS. 3 and 4 are shown above the floating electrodes, they can just as well be located below the floating electrodes. For this purpose, all that is necessary is to modify the sequence of process steps during the manufacture, as illustrated in FIG. 8, which corresponds to FIG. 3.

Figure 5:
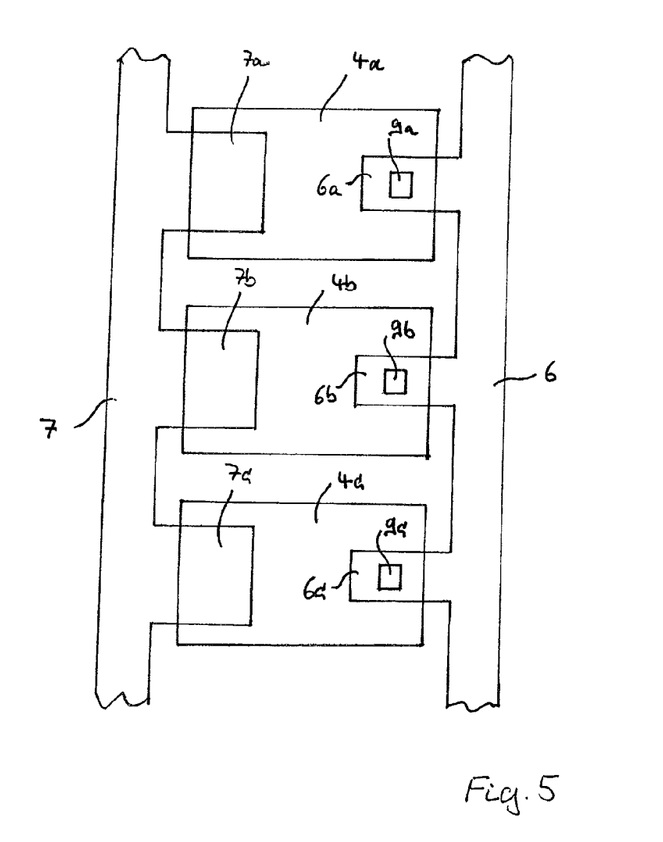
FIG. 5 is a plan, phantom view of the surface of a carrier wafer.

FIG. 5 shows an overhead view of a detail of a carrier wafer according to this invention. FIG. 5 shows an overhead view of the floating electrodes 4a, 4b and 4c located next to one another in the plane of the carrier wafer. These electrodes are charged by the feeder line 6 by means of finger-like feeder segments 6a, 6b, and 6c that branch off from it. For this purpose, these feeder line segments 6a, 6b and 6c are designed as illustrated in FIG. 3 so that they form tunnel windows in the insulation layer 3 opposite the electrodes 4a, 4b and 4c. The tunnel windows 9a, 9b and 9c are then used to charge the floating electrodes 4a, 4b and 4c with charge carriers.

On the opposite side of the floating electrodes 4a, 4b and 4c, and as shown in FIG. 3, there is a feeder line 7 with incoming feeder segments 7a, 7b and 7c.

Figure 6:
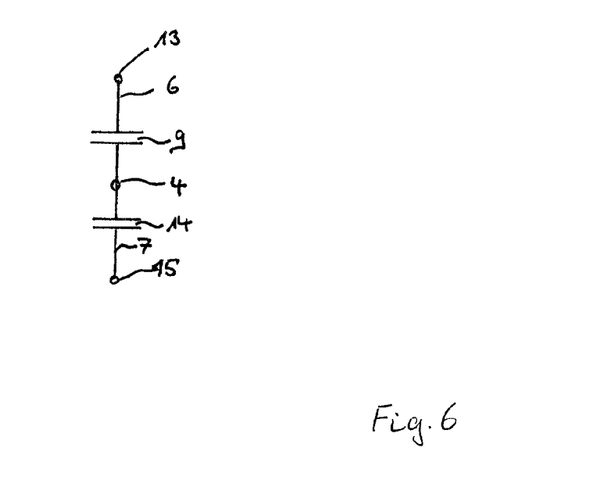
FIG. 6 is an equivalent circuit diagram of the electrical structures on a carrier wafer.

FIG. 6 shows an equivalent circuit diagram for the electrical interconnection of the feeder line and the floating electrodes on the carrier wafer 1 according to the invention, as illustrated by way of example in FIGS. 1 to 5. Reference numbers 13 and 15 indicate an external contact to which a voltage can be applied. The line 6 leads to a capacitance 9 that is formed by the tunnel window between the incoming feeder 6 and the electrode 4 insulated on all sides. The reference number 15 indicates a common counter-electrode that is connected with a capacitance 14. The capacitance 14 is located between the counter-electrodes illustrated in FIG. 5 as 7a, 7b and 7c and the electrodes 4a, 4b and 4c insulated on all sides.

During the charging of the two capacitances, the potential of the floating electrode 4 is set according to the ratio of the capacitances. As soon as a critical field strength is achieved at the capacitance 9, the tunnel current according to the Fowler-Nordheim tunnel effect begins. The field strength does not increase any further, but electrons are stored in the floating electrode. These stored electrons remain even after the voltage is de-energized and generate the electrical field according to the invention.

Figure 7:
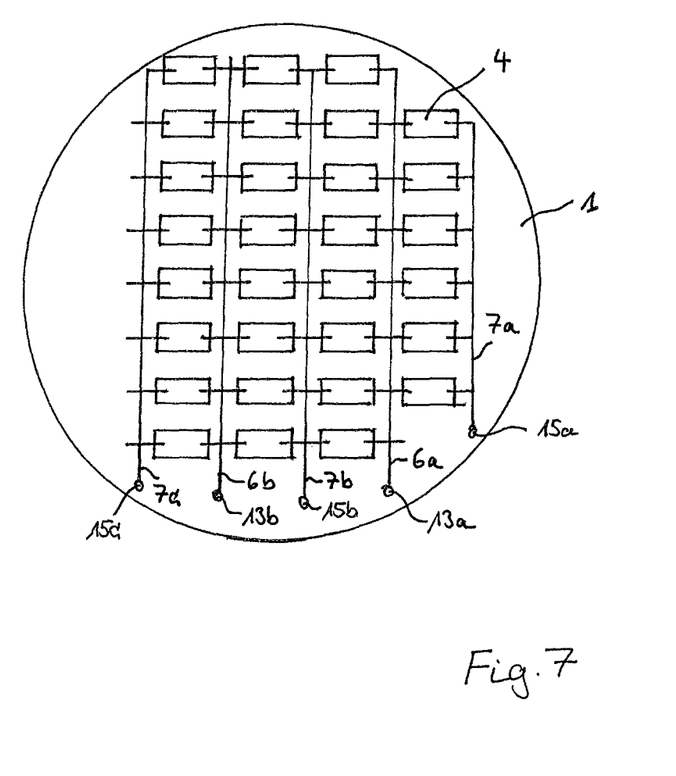
FIG. 7 is a detail of an overhead view of a carrier wafer claimed by the invention.

FIG. 7 shows a detail of a plan view of a carrier wafer 1 according to the invention. The figure shows the interconnection of the floating electrodes, of which only one is indicated by the reference number 4, to make the illustration easier to understand. In reality, the number of floating electrodes, feeder lines and groups is much greater than shown, and as described above can be many thousands or millions.

The construction of this electrode array is basically the same as the one illustrated in FIG. 5. The floating electrodes 4 are assembled by rows into groups, and each group is charged by means of the same incoming feeder 13*a* or 13*b* etc. and 6*a*, 6*b* etc. The charging can thereby be effected as explained above through Fowler-Nordheim tunnels or by the injection of hot charge carriers. On the other side, the floating electrodes 4 are also provided, also in groups, with lines 7*a*, 7*b* and 7*c* etc. and grounding contacts 15*a*, 15*b*, 15*c* etc.

If charges of different polarity are then applied to the incoming feeders 6*a* and 6*b* (13*a* and 13*b*), the rows of floating electrodes are charged in alternation with charge carriers of different polarity.

Each two neighboring rows of floating electrodes 4 are thereby charged with charge carriers of the same polarity. Overall, in particular if the illustrated array covers a large surface area, there is an alternating charging of the floating electrodes 4 and overall a bipolar carrier wafer. Of course, the individual rows coupled with each other can be charged in alternation with different charge carriers as well as with different numbers of charge carriers, resulting in a complex charge pattern and therefore a complex characteristic of the electrical field that is designed to hold the utilizable wafer.

What is claimed is:

1. A mobile carrier wafer with a first flat surface for the electrostatic holding of a flexible substrate, comprising:
    a plurality of at least 50 floating electrodes insulated on all sides electrically insulated by means of one or more electrical insulation layers and located next to each other with respect to the plane of the first flat surface, wherein for the floating electrodes at least one electrical line is provided as a feeder electrode and at least one electrical line is provided as a counter-electrode for the charging of the floating electrodes by means of Fowler-Nordheim tunnels or by the injection of hot charge carriers.

2. The mobile carrier wafer of claim 1, wherein for each of the floating electrodes at least one of the insulation layers has an area located next to the floating electrode for the charging of the floating electrode.

3. The mobile carrier wafer of claim 2, wherein at least one, some or all of the areas for charging are connected with a structure for the generation of hot charge carriers or are located next to it.

4. The mobile carrier wafer of claim 3, wherein for at least two groups of floating electrodes, floating electrodes from different groups are located next to one another in the plane of the first surface and are charged if necessary with charges of different voltages.

5. The mobile carrier wafer of claim 1, wherein at least one, some or all of the areas for charging have a lower thickness than the insulation layer that is next to it and the surrounding areas.

6. The mobile carrier wafer of claim 1, wherein the floating electrodes are divided into at least two groups of floating electrodes, and wherein a dedicated common feeder electrode is provided for each of the groups.

7. The mobile carrier wafer of claim 1, wherein a voltage is applied from the outside to each supply electrode and a counter-electrode.

8. The mobile carrier wafer of claim 1, wherein the plurality of floating electrodes has 50 electrodes in total or in each group.

9. The mobile carrier wafer of claim 1, wherein the plurality of floating electrodes has 10,000 electrodes in total or in each group.

10. The mobile carrier wafer of claim 1, wherein for two, a plurality of or all groups of floating electrodes, the floating electrodes of each group are arranged in a row and the groups of floating electrodes are separate and parallel to one another.

11. The mobile carrier wafer of claim 1, wherein for two, a plurality of or all groups of floating electrodes, the floating electrodes of each group are arranged in fractal patterns and the groups of floating electrodes are located next to one another or interlinked with one another.

12. The mobile carrier wafer of claim 1, wherein for two, a plurality of or all groups of floating electrodes, the floating electrodes have different sizes.

13. The mobile carrier wafer of claim 1, wherein the carrier wafer, the insulation layers and/or the floating electrodes consist of or comprise, at least partly or in areas, material that is permeable to UV light or have recessed areas that are UV-permeable.

14. The mobile carrier wafer of claim 1, wherein the carrier wafer, the insulation layers and/or the floating electrodes consist of or comprise, at least partly or in areas, material that is permeable to UV light, and consist of or comprise glass, quartz glass and/or sapphire, or have recessed areas that are UV-permeable.

15. The mobile carrier wafer of claim 1, wherein one, a plurality of or all of the plurality of floating electrodes have a lateral dimension Ae in the plane of the carrier layer of 100 nm≤Ae≤1 mm.

16. The mobile carrier wafer of claim 1, wherein the total surface area of the floating electrodes and the total surface area of the first surface are in a ratio ≥5%.

17. The mobile carrier wafer of claim 1, wherein the total surface area of the floating electrodes and the total surface area of the first surface are in a ratio ≥25%.

18. The mobile carrier wafer of claim 1, wherein the total surface area of the floating electrodes and the total surface area of the first surface are in a ratio ≥50%.

19. A method for holding a flexible substrate by means of electrostatic force on a mobile carrier wafer as recited in claim 1, wherein the flexible substrate is placed on the first, plane surface of the carrier wafer and voltages are then applied to at least one, a plurality of or all of the floating electrodes, and then the voltages are de-energized.

20. The method of claim 19, wherein different voltages are applied to two floating electrodes next to each other.

21. The method of claim 19, wherein the mobile carrier wafer is then irradiated with UV light until the extensive discharge of the floating electrodes and then the flexible substrate is removed from the carrier wafer.

22. A method for the manufacture of a mobile carrier wafer as recited in claim 1, wherein the mobile carrier wafer is flat and has a front side with a first, plane surface, and a plurality of at least 50 floating electrodes are located directly or via one or more intermediate layers, and wherein for the floating electrodes, at least one electrical line as a current feeder electrode and at least one electrical line as a counter-electrode are located for the charging of the floating electrodes by means of Fowler-Nordheim tunnels or by the injection of hot charge carriers.

* * * * *